United States Patent
Huang

(10) Patent No.: US 12,334,945 B2
(45) Date of Patent: Jun. 17, 2025

(54) TIME-INTERLEAVED ANALOG TO DIGITAL CONVERTER BASED ON FLASH ANALOG TO DIGITAL CONVERSION

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 244 days.

(21) Appl. No.: 18/140,746

(22) Filed: Apr. 28, 2023

(65) Prior Publication Data
US 2024/0113720 A1    Apr. 4, 2024

(30) Foreign Application Priority Data
Sep. 29, 2022   (TW) .................................. 111137115

(51) Int. Cl.
*H03M 1/08*  (2006.01)
*H03M 1/00*  (2006.01)
*H03M 1/10*  (2006.01)

(52) U.S. Cl.
CPC .............. *H03M 1/08* (2013.01); *H03M 1/002* (2013.01); *H03M 1/10* (2013.01); *H03M 1/1009* (2013.01); *H03M 1/1023* (2013.01)

(58) Field of Classification Search
CPC ........ H03M 1/08; H03M 1/10; H03M 1/1009; H03M 1/1023; H03M 1/002
See application file for complete search history.

(56) References Cited

U.S. PATENT DOCUMENTS

| | | |
|---|---|---|
| 5,990,815 A | 11/1999 | Linder et al. |
| 10,763,875 B2 | 9/2020 | Huang |
| 10,778,242 B2 | 9/2020 | Huang |
| 10,790,843 B2 | 9/2020 | Huang |
| 11,239,853 B1 | 2/2022 | Dai et al. |
| 2016/0079994 A1* | 3/2016 | Lee .......................... H03M 1/46 341/118 |
| 2021/0250040 A1 | 8/2021 | Jang et al. |

OTHER PUBLICATIONS

Huang, "Time Interleaved Analog to Digital Converter", U.S. Appl. No. 17/870,983, filed Jul. 22, 2022, USPTO.

* cited by examiner

*Primary Examiner* — Joseph J Lauture
(74) *Attorney, Agent, or Firm* — WPAT, PC

(57) ABSTRACT

A time-interleaved analog to digital converter (ADC) includes capacitor array circuits, a flash ADC, first and second circuits, a converter, and an encoder circuit. The capacitor array circuits sample an input signal and generate first residue signals according to first quantization signals. The flash ADC samples the input signal and generates the first quantization signals. The first circuits transfer the first residue signals from the capacitor array circuits. The converter performs a signal conversion according to the first and the second residue signals to generate a second quantization signal. The second circuits transfer second residue signals to the converter. The capacitor array circuits further generate the second residue signal in response to the signal conversion. The encoder circuit generates a digital output according to one of the first quantization signals and the second quantization signals.

14 Claims, 7 Drawing Sheets

TIME-INTERLEAVED ANALOG TO DIGITAL CONVERTER BASED ON FLASH ANALOG TO DIGITAL CONVERSION

BACKGROUND OF THE INVENTION

1. Field of the Invention

The present disclosure relates to a time-interleaved analog to digital converter, especially to a time-interleaved analog to digital converter based on a flash analog to digital conversion.

2. Description of Related Art

Analog to digital converters are widely utilized in various electronic devices to convert an analog signal to a corresponding digital signal for subsequent signal processing. As the operating speed increases, the operational period for an analog to digital converters to convert signals becomes shorter and shorter. As a result, requirements (e.g., switching speed, power consumption, etc.) of some circuits (e.g., sampling circuit, comparator circuit, etc.) of analog to digital converter are getting higher, which makes it more difficult to implement analog to digital converter circuits suitable for high-speed applications.

SUMMARY OF THE INVENTION

In some aspects of the present disclosure, an object of the present disclosure is, but not limited to, provide a time-interleaved analog to digital converter based on a flash analog to digital conversion, so as to make an improvement to the prior art.

In some aspects of the present disclosure, a time-interleaved analog to digital converter includes a plurality of capacitor array circuits, a flash analog to digital converter circuitry, a plurality of first transfer circuits, a converter circuitry, a plurality of second transfer circuits, and an encoder circuit. The plurality of capacitor array circuits are configured to sequentially sample an input signal and generate a plurality of first residue signals according to a plurality of first quantization signals. The flash analog to digital converter circuitry is configured to sample the input signal and sequentially generate the plurality of first quantization signals. The plurality of first transfer circuits are configured to sequentially transfer the plurality of first residue signals from the plurality of capacitor array circuits according to a plurality of first control signals. The converter circuitry is configured to perform a noise shaping signal conversion according to a first signal in a plurality of first residue signals and a second signal in plurality of second residue signals, in order to generate a second quantization signal. The plurality of second transfer circuits are configured to sequentially transfer the plurality of second residue signals from the plurality of capacitor array circuits to the converter circuitry according to a plurality of second control signals, in which the plurality of capacitor array circuits further generate the plurality of second residue signals in response to the noise shaping signal conversion. The encoder circuit is configured to generate a digital output according to a second quantization signal and a corresponding signal of the plurality of first quantization signals.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may be a single system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

In some embodiments, implementations of certain circuits may be understood with reference to related circuits in a first literature (U.S. Pat. No. 10,763,875), a second literature (U.S. Pat. No. 10,778,242) and a third literature (U.S. Pat. No. 10,790,843), but the implementations of those circuits are not limited thereto. These literatures are incorporated by reference herein in their entirety and for all purposes.

Figure 1A:
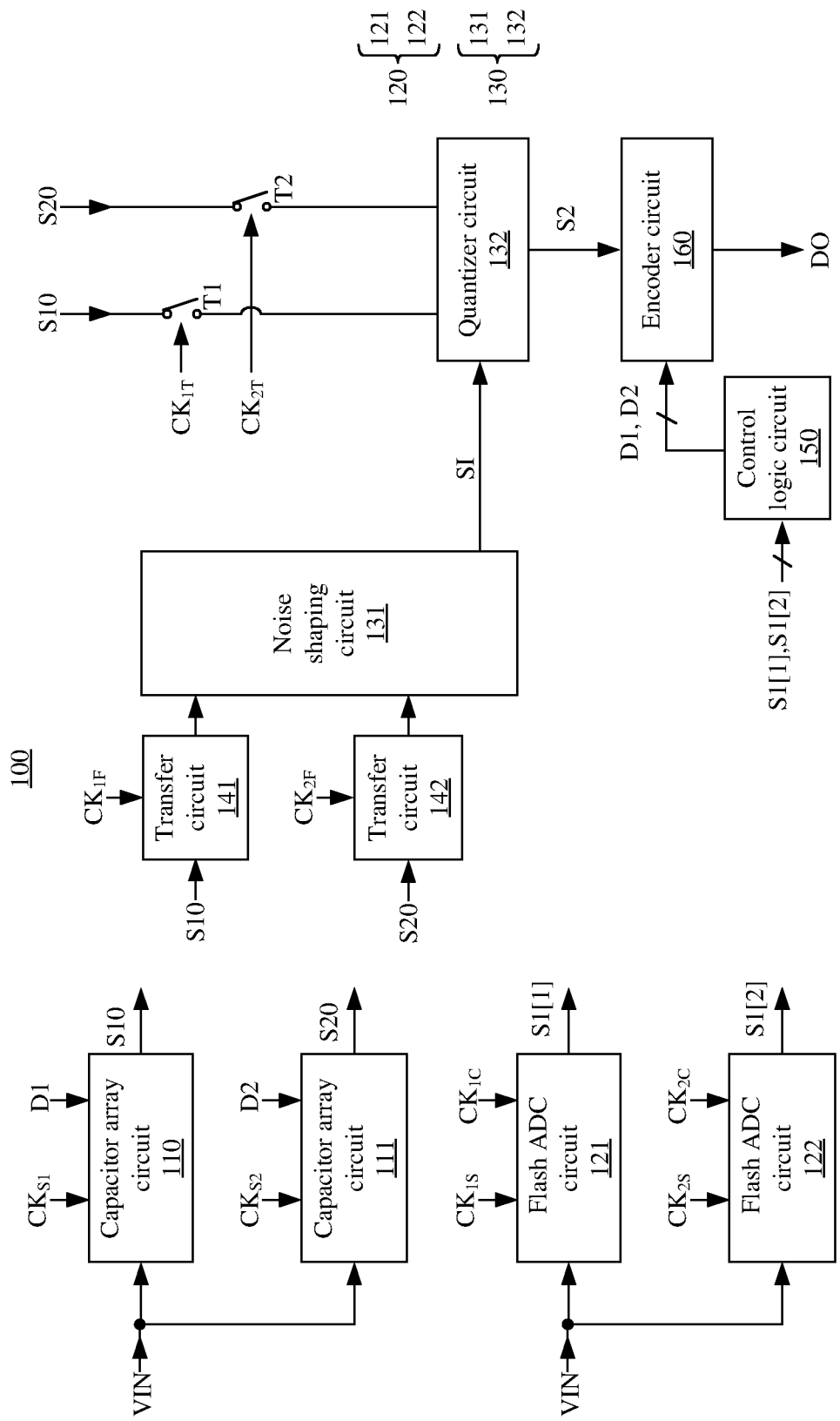
FIG. 1A illustrates a schematic diagram of a time-interleaved analog to digital converter according to some embodiments of the present disclosure.

FIG. 1A illustrates a schematic diagram of a time-interleaved analog to digital converter 100 according to some embodiments of the present disclosure. In some embodiments, the time-interleaved analog to digital converter 100 generates a digital output DO mainly based on a flash analog to digital conversion.

The time-interleaved analog to digital converter 100 includes capacitor array circuits 110-111, a flash analog to digital converter (ADC) circuitry 120, a converter circuitry 130, transfer circuits T1-T2, transfer circuits 141-142, a control logic circuit 150, and an encoder circuit 160. The capacitor array circuits 110-111 sequentially sample an input signal VIN according to control signals $CK_{S1}$ and $CK_{S2}$, and generate signals S10 and S20 according to quantization signals S1[1]-S1[2]. For example, the capacitor array circuit 110 samples the input signal VIN according to the control signal $CK_{S1}$, and is switched according to the digital code D1 (which is generated based on the quantization signal S1[1]) to generate the signal S10. Similarly, the capacitor array circuit 111 samples the input signal VIN according to the control signal $CK_{S2}$, and is switched according to the digital code D2 (which is generated based on the quantization signal S1[2]) to generate the signal S20.

In some embodiments, implementations of each of the capacitor array circuits 110 and 111 can be understood with reference to the capacitor C1 in the first literature or the capacitor array circuit CT1 in the second literature or the third literature, but the present disclosure is not limited thereto. Taking the capacitor array circuit 110 as an example, the capacitor array circuit 110 may include switches (not shown) and capacitors (not shown). First terminals of the capacitors may receive the input signal VIN via a switch (which may be controlled by the control signal $CK_{S1}$), and second terminals of the capacitors may be switched via the remaining switches (hereinafter referred to as specific switches) to receive different reference voltages, in which the specific switches are controlled by different bits of the digital code D1, and the digital code D1 is generated according to the quantization signal S1[1]. During a sampling phase, the capacitors may store charges corresponding to the input signal VIN. Afterwards, after the specific switches are switched in response to the digital code D1, the residue voltage on the capacitors may form the signal S10 at that time (or at that moment). With this analogy, it is able to understand the related arrangements of the capacitor array circuit 111. In some other embodiments, the first terminals of the capacitors may set to output the signal S10, and the second terminals of the capacitors may selectively receive the input signal VIN, a first reference voltage, or a second reference voltage via switches, in which the first reference voltage and the second reference voltage may be the reference voltage $V_{refp}$ and the reference voltage $V_{refn}$, respectively, in the first third literature, the second literature, and/or the third literature. In some embodiments, each of the signals S10 and S20 may be a signal on the node N1 in the first third literature, the second literature, and/or the third literature, but the present disclosure is not limited thereto.

For ease of understanding, in the present disclosure, the signal S10 that is generated after the capacitor array circuit 110 is switched by the digital code D1 and the signal S20 that is generated after the capacitor array circuit 111 is switched by the digital code D2 are referred to as "first residue signals." Moreover, in the present disclosure, the signal S10 and the signal S20 that are respectively generated by the capacitor array circuit 110 and the capacitor array circuit 111 in response to a noise shaping signal conversion performed by the converter circuitry 130 are referred to as "second residue signals."

The flash ADC circuitry 120 may sample the input signal VIN and generate the quantization signal S1[1] and S1[2], in which the quantization signal S1[1] corresponds to the capacitor array circuit 110, and the quantization signal S1[2] corresponds to the capacitor array circuit 111. In this example, the flash ADC circuitry 120 includes a flash ADC circuit 121 and a flash ADC circuit 122. The flash ADC circuit 121 samples the input signal VIN according to the control signal $CK_{S1}$, and converts the sampled input signal (e.g., the signal VIN' in FIG. 3) according to a control signal $CK_{1C}$ into the quantization signal S1[1]. Similarly, the flash ADC circuit 122 samples the input signal VIN according to the control signal $CK_{S2}$, and converts the sampled input signal (e.g., the signal VIN' in FIG. 3) into the quantization signal S1[2] according to a control signal $CK_{2C}$.

In some embodiments, the control signal $CK_{S1}$ and the control signal $CK_{1S}$ have the same enabling intervals, such that the capacitor array circuit 110 and the flash ADC circuit 121 may sample the input signal VIN concurrently. Similarly, in some embodiments, the control signal $CK_{S2}$ and the control signal $CK_{2S}$ may have the same enabling intervals, such that the capacitor array circuit 111 and the flash ADC circuit 122 may sample the input signal VIN concurrently.

The control logic circuit 150 generates a corresponding one of the digital code D1 and the digital code D2 according to the quantization signals S1[1] and S1[2]. For example, the control logic circuit 150 may generate the digital code D1 according to the quantization signal S1[1] and may generate the digital code D2 according to the quantization signal S1[2]. In some embodiments, the control logic circuit 150 may be implemented with digital circuit(s) for processing encoding, redundancy, and/or errors (which may be, for example but not limited to, bubble errors).

Figure 3:
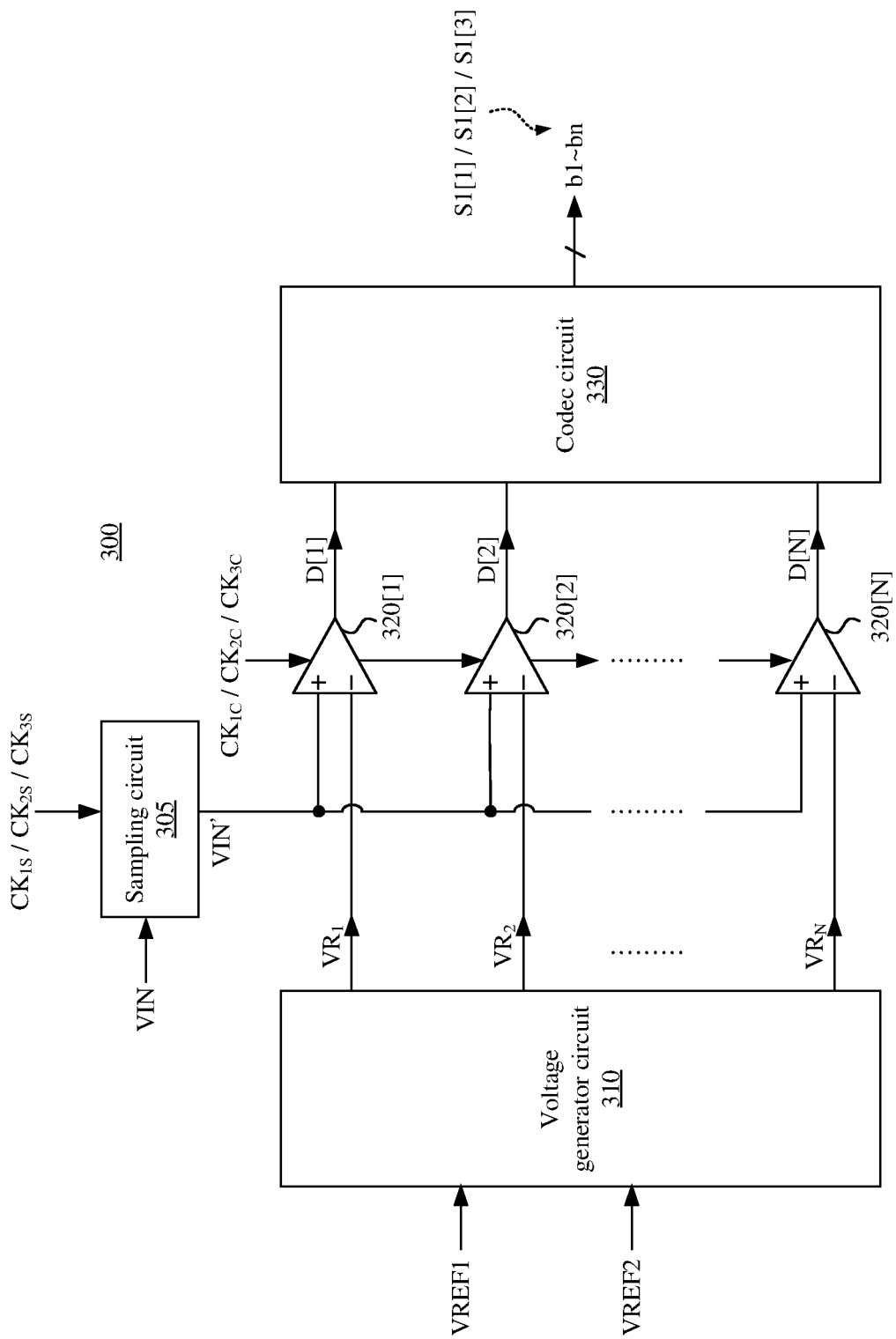
FIG. 3 illustrates a schematic diagram of a flash ADC circuit according to some embodiments of the present disclosure.

In some embodiments, each of the flash ADC circuits 121 and 122 may include comparator circuits (e.g., the comparator circuits 320[1]-320[N] in FIG. 3) and a codec circuit (e.g., the codec circuit 330 in FIG. 3). Under this condition, the quantization signals S1[1] and S1[2] may be outputs of the codec circuit. Alternatively, in some embodiments, each of the flash ADC circuit 121 and 122 may exclude the codec circuit. Under this condition, the quantization signals S1[1] and S1[2] may be outputs of the comparator circuits, and the control logic circuit 150 may be configured to perform operations of the codec circuit. The arrangements and operations about the control logic circuit 150 are given for illustrative purposes, and the present disclosure is not limited thereto.

The transfer circuits T1 and T2 are configured to sequentially transfer the signals S10 and S20 (i.e., the first residue signals) from the capacitor array circuits 110 and 111 to the converter circuitry 130 according to the control signals $CK_{1T}$ and $CK_{2T}$. In greater detail, each of the transfer circuits T1 and T2 transfers the corresponding signal S10 or S20 from the corresponding capacitor array circuit 110 or 111 to the converter circuitry 130 according to a corresponding one of the control signals $CK_{1T}$ and $CK_{2T}$ after a corresponding one of the flash ADC circuits 121 and 122 generates the corresponding quantization signal (e.g., the quantization signal S1[1] or S1[2]). For example, after the flash ADC circuit 121 generates the quantization signal S1[1], the transfer circuit T1 is turned on according to the control signal $CK_{1T}$, in order to transmit the residue voltage on the capacitor array circuit 111 (i.e., the signal S10 at that moment) to be a corresponding one of the first residue signals. With this analogy, it is able to understand the corresponding relation among the signal S20, the flash ADC circuit 122, and the transfer circuit T2. In some embodiments, each of the transfer circuits T1-T2 may be implemented with switch circuit(s), but the present disclosure is not limited thereto.

The converter circuitry 130 performs the noise shaping signal conversion according to a first signal in the first residue signals and a second signal in the second residue signals, in order to generate the quantization signal S2. In some embodiments, the capacitor array circuits 110 and 111 further generate the second residue signals (i.e., the signal S10 or S20 at that moment) in response to the noise shaping signal conversion. For example, after the transfer circuit T1 transfers the signal S10 to the converter circuitry 130, the converter circuitry 130 may perform the noise shaping signal conversion. After this noise shaping signal conversion is performed, the signal S10 of the capacitor array circuit 110 (which may be considered as the residue voltage on the capacitor array circuit 110 at this moment) is one of the second residue signals. Alternatively, after the transfer circuit T2 transfers the signal S20 to the converter circuitry 130, the converter circuitry 130 may perform the noise shaping signal conversion. After this noise shaping signal conversion is performed, the signal S20 of the capacitor array circuit 111 (which may be considered as the residue voltage on the capacitor array circuit 111 at this moment) is one of the second residue signals. The converter circuitry 130 may process one of the second residue signals (i.e., the second signal), and perform a quantization according to the processed result (i.e., the signal SI) and the first signal to generate the quantization signal S2.

The transfer circuits 141 and 142 are configured to sequentially transfer the second residue signals from the capacitor array circuits 110 and 111 to the converter circuitry 130 according to control signals $CK_{1F}$ and $CK_{2F}$. As mentioned above, the second residue signals are signals generated by the capacitor array circuits 110 and 111 in response to the noise shaping signal conversion performed by the converter circuitry 130. In other words, after the noise shaping signal conversion is performed, a corresponding one of the signal S10 and the signal S20 is a corresponding one of the second residue signals. For example, after the noise shaping signal conversion that is performed following the generation of the quantization signal S1[1] is completed, the transfer circuit 141 may be turned on according to the control signal $CK_{1F}$ to transfer the signal S10 from the capacitor array circuit 110 to be a corresponding one of the second residue signals. Alternatively, after the noise shaping signal conversion that is performed following the generation of the quantization signal S1[2] is completed, the transfer circuit 142 may be turned on according to the control signal $CK_{2F}$ to transfer the signal S20 from the capacitor array circuit 111 to be a corresponding one of the second residue signals. In some embodiments, each of the transfer circuits 141 and 142 may be implemented with switch circuit(s), but the present disclosure is not limited thereto.

In some embodiments, the converter circuitry 130 includes a noise shaping circuit 131 and a quantizer circuit 132. The noise shaping circuit 131 is coupled to the transfer circuits 141 and 142 to sequentially receive the second residue signals, and processes the second signal in the second residue signals to generate a signal SI. The quantizer circuit 132 may sequentially receive the first residue signals from the transfer circuits T1-T2, and perform the quantization according to the signal SI and the first signal in the first residue signals to generate the quantization signal S2. In this embodiment, the quantizer circuit 132 may be a comparator circuit (not shown) having more than two input terminals. For example, the comparator circuit may include two input pairs (which correspond to the aforementioned input terminals), in which one input pair receives the first signal, another one input pair receives the signal SI, and the comparator circuit may generate the quantization signal S2 according to the summation of the first signal and the signal SI. In some embodiments, the noise shaping circuit 131 may include an integrator circuit and a circuit portion for storing the second signal. In some embodiments, implementations of the transfer circuits 141-142 may be understood with reference to the implementation of the capacitors Cex5-Cex6 in FIG. 5A of the third literature, the implementation of the noise shaping circuit 131 may be understood with reference to the circuit 120 (or the circuit 122) in FIG. 5A of the third literature, and the implementations of the quantizer circuit 132 may be understood with reference to the circuit 140A (or the circuit 140B) in FIG. 5A of the third literature, but the present disclosure is not limited thereto.

The encoder circuit 160 is configured to generate digital output DO according to the quantization signal S2 and a corresponding signal of the quantization signals S1[1] and S1[2]. As mentioned above, the quantization signal S2 is generated according to the first signal of the first residue signals and the second signal of the second residue signals. If the first signal is generated from the capacitor array circuit 110, the corresponding signal of the quantization signals S1[1] and S1[2] is the quantization signal S1[1] (as the flash ADC circuitry 120, which generates the quantization signal S1[1], and the capacitor array circuit 110 sample the input signal VIN concurrently, in order to respectively generate the quantization signal S1[1] and the first signal), and the encoder circuit 160 may combine the digital code D1 (which is generated according to the corresponding signal (i.e., the quantization signal S1[1])) and the quantization signal S2 to generate the digital output DO.

Alternatively, if the first signal is generated from the capacitor array circuit 111, the corresponding signal of the quantization signals S1[1] and S1[2] is the quantization signal S1[2] (as the flash ADC circuitry 120 and the capacitor array circuit 111 sample the input signal VIN concurrently, in order to respectively generate the quantization signal S1[2] and the first signal), and the encoder circuit 160 may combine the digital code D2 (which is generated according to the corresponding signal (i.e., the quantization signal S1[2])) and the quantization signal S2 to generate the digital output DO. In some embodiments, the encoder circuit 160 may be implemented with digital logic circuit(s).

Figure 1B:
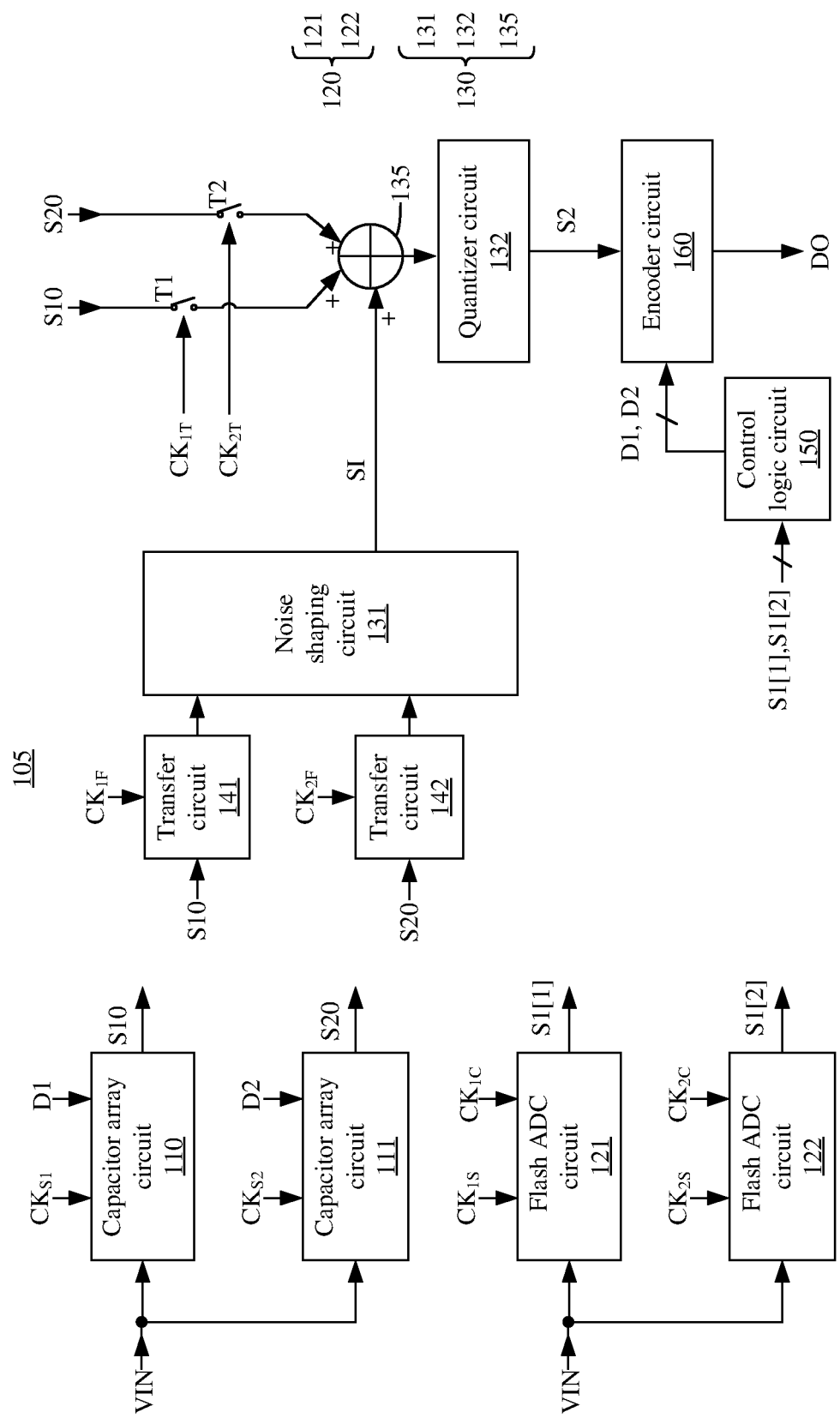
FIG. 1B illustrates a schematic diagram of a time-interleaved analog to digital converter according to some embodiments of the present disclosure.

FIG. 1B illustrates a schematic diagram of a time-interleaved analog to digital converter 105 according to some embodiments of the present disclosure. Compared with the time-interleaved analog to digital converter 100 in FIG. 1A, in the time-interleaved analog to digital converter 105, the converter circuitry 130 further includes a summing circuit 135, which may sum up the first residue signal (i.e., a corresponding one of the signals S10 and S20) and the signal SI. In this embodiment, the quantizer circuit 132 may be a comparator circuit having two input terminals, in which one input terminal may receive a first input signal, and another input terminal (not shown in the figure) may receive a second input signal, the first input signal and the second input signal may have different polarities, and the amplitude of each of the first input signal and the second input signals is the summation of the first residue signal and the signal SI (i.e., the first and the second input signals are differential signals). The quantizer circuit 132 may perform the quantization according to the summation of the first residue signal and the signal SI to generate the quantization signal S2. In some embodiments, the summing circuit 135 may be implemented with a switched capacitor circuit. For example, the implementation of the quantizer circuit 132 may be understood with reference to the comparator circuit 220 in the first literature, and the implementation of the summing circuit 135 may be understood with reference to the switching circuit 120 in the first literature, but the present disclosure is not limited thereto.

Figure 2A:
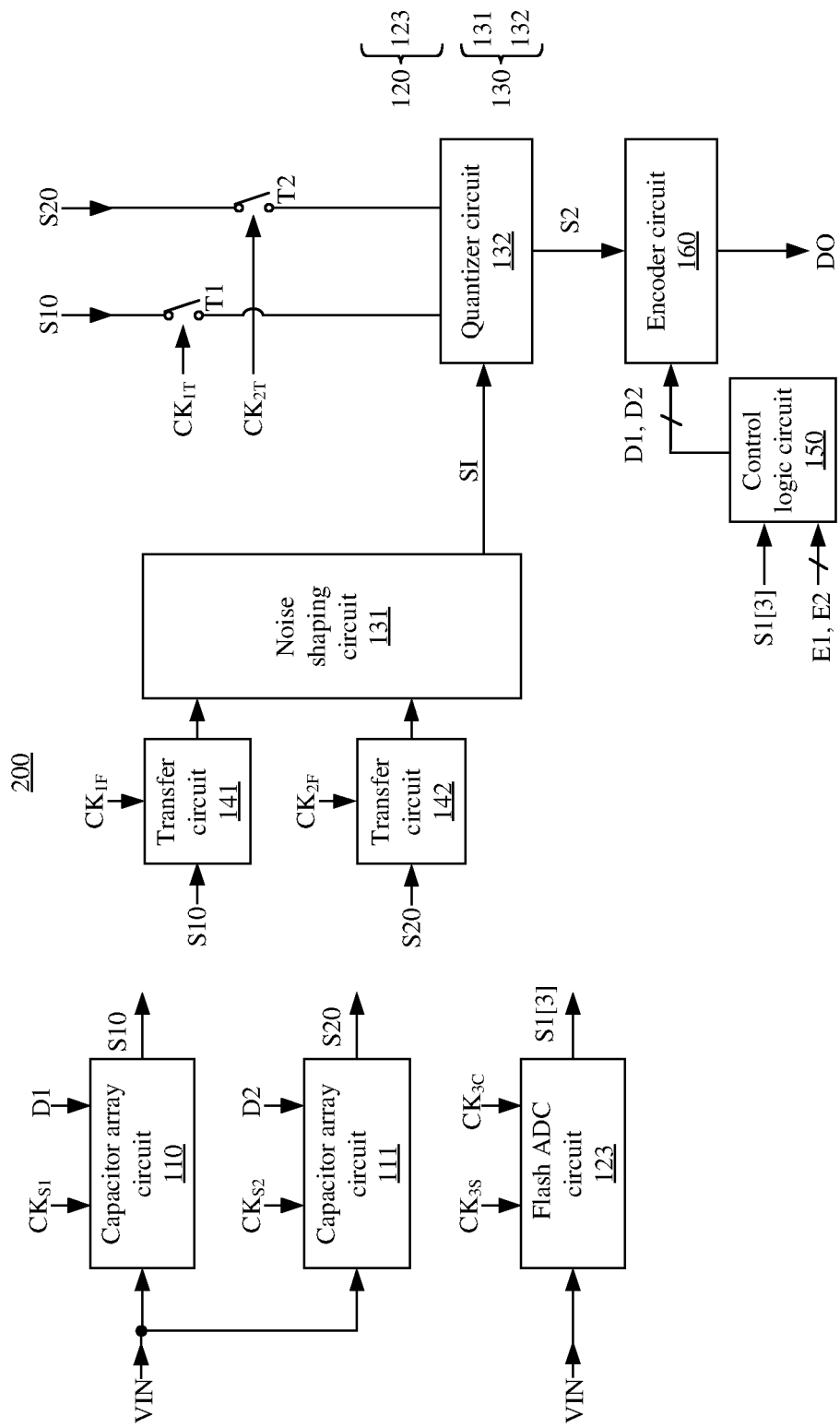
FIG. 2A illustrates a schematic diagram of a time-interleaved analog to digital converter according to some embodiments of the present disclosure.

FIG. 2A illustrates a schematic diagram of a time-interleaved analog to digital converter 200 according to some embodiments of the present disclosure. Compared with FIG. 1A or FIG. 1B, in this example, the flash ADC circuitry 120 includes only a flash ADC circuit 123. The flash ADC circuit 123 sequentially samples the input signal VIN according to a control signal $CK_{3S}$, and converts the sampled input signal VIN into a quantization signal S1[3] according to a control signal $CK_{3C}$.

In some embodiments, an enabling interval of the control signal $CK_{3S}$ is equal to the combination of enabling intervals of the control signals $CK_{1S}$ and $CK_{2S}$ in FIG. 1A or FIG. 1B, an enabling interval of the control signal $CK_{3C}$ is equal to the combination of enabling intervals of the control signal $CK_{1C}$ and $CK_{2C}$. As a result, circuit area can be further saved. In this example, the flash ADC circuit 123 and any one of the capacitor array circuits 110 and 111 may sample the input signal VIN concurrently.

For example, when the capacitor array circuit 110 samples the input signal VIN, the flash ADC circuit 123 samples the input signal VIN. Under this condition, the quantization signal S1[3] generated from the flash ADC circuit 123 may equal to the quantization signal S1[1] in FIG. 1A or FIG. 1B. Alternatively, when the capacitor array circuit 111 samples the input signal VIN, the flash ADC circuit 123 samples the input signal VIN. Under this condition, the quantization signal S1[3] generated from the flash ADC circuit 123 may equal to the quantization signal S1[2] in FIG. 1A or FIG. 1B. In other words, the quantization signal S1[3] sequentially corresponds to the quantization signals S1[1] and S1[2] at different time.

In some embodiments, the control logic circuit 150 further outputs the digital code D1 or D2 to a corresponding one of the capacitor array circuits 110 and 111 according to an enable signal E1 and an enable signal E2. For example, when the capacitor array circuit 110 and the flash ADC circuit 123 sample the input signal VIN concurrently, the quantization signal S1[3] corresponds to the digital code D1. Under this condition, after the flash ADC circuit 123 generates the quantization signal S1[3], the enable signal E1 is switched to have a predetermined logic value (which may be, for example and is not limited to, a logic value of 1). As a result, the control logic circuit 150 may generate the digital code D1 according to the quantization signal S1[3], and transmit the digital code D1 to the capacitor array circuit 110. Alternatively, when the capacitor array circuit 111 and the flash ADC circuit 123 samples the input signal VIN concurrently, the quantization signal S1[3] corresponds to the digital code D2. Under this condition, after the flash ADC circuit 123 generates the quantization signal S1[3], the enable signal E2 is switched to be a predetermined logic value (which may be, for example but not limited to, a logic value of 1). As a result, the control logic circuit 150 may generate the digital code D2 according to the quantization signal S1[3], and transmit the digital code D2 to the capacitor array circuit 111. Detailed descriptions regarding herein will be provided with reference to FIG. 5.

Figure 2B:
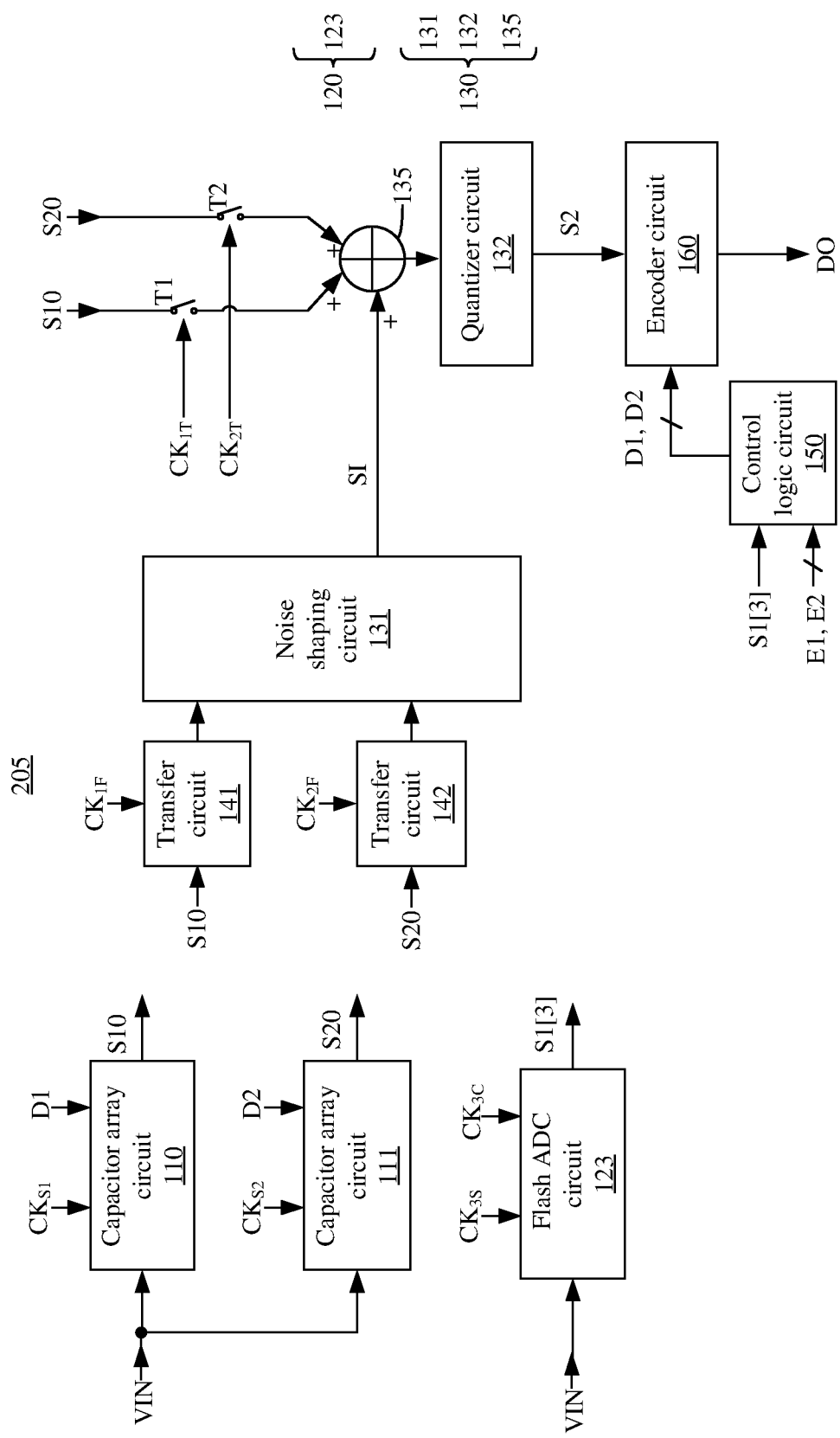
FIG. 2B illustrates a schematic diagram of a time-interleaved analog to digital converter according to some embodiments of the present disclosure.

FIG. 2B illustrates a schematic diagram of a time-interleaved analog to digital converter 205 according to some embodiments of the present disclosure. Compared with the time-interleaved analog to digital converter 200 in FIG. 2A, in the time-interleaved analog to digital converter 205, the converter circuitry 130 further includes the summing circuit 135. The related descriptions about the summing circuit 135 may be understood with reference to FIG. 1B, and thus the repetitious descriptions are not further given.

In FIG. 1A and FIG. 1B, the number of the capacitor array circuits is the same as that of the flash ADC circuits, but the present disclosure is not limited thereto. In different embodiments, the number of the capacitor array circuits may be set according to practical requirements, and the number of flash ADC circuits may be set according to different implementations.

FIG. 3 illustrates a schematic diagram of a flash ADC circuit 300 according to some embodiments of the present disclosure. In some embodiments, the flash ADC circuit 300 may be utilized to implement one or more flash ADC circuits in FIG. 1A, FIG. 1B, FIG. 2A and/or FIG. 2B (e.g., the flash ADC circuits 121-123). The flash ADC circuit 300 includes a sampling circuit 305, a voltage generator circuit 310, comparator circuits 320[1]-320[N], and a codec circuit 330. The sampling circuit 305 may sample the input signal VIN according to a corresponding one of the control signals $CK_{1S}$-$CK_{3S}$, in order to generate a sampled input signal VIN'. The voltage generator circuit 310 is configured to generate voltages $VR_1$-$VR_N$ having different values. For example, the voltage generator circuit 310 may be a voltage divider circuit which may divide a reference voltage VREF1 and a reference voltage VREF2 to generate the voltages $VR_1$-$VR_N$. The comparator circuits 320[1]-320[N] may compare the sampled input signal VIN' with each of the voltages $VR_1$-$VR_N$ according to a corresponding one of the control signals $CK_{1C}$, $CK_{2C}$, or $CK_{3C}$ to generate decision signals D[1]-D[N]. The codec circuit 330 may convert the decision signals D[1]-D[N] into bits b1-$bn$ of a corresponding one of the quantization signals S1[1], S1[2], and S1[3]. For example, the codec circuit 330 may convert a thermometer code (i.e., the decision signals D[1]-D[N]) into a binary code (i.e., the bits b1-$bn$), but the present disclosure is not limited thereto.

For example, if the sampling circuit 305 receives the control signal $CK_{1S}$ and the comparator circuits 320[1]-320[N] receive the control signal $CK_{1C}$, the codec circuit 330 generates the quantization signal S1[1]. If the sampling circuit 305 receives the control signal $CK_{2S}$ and the comparator circuits 320[1]-320[N] receive the control signal $CK_{2C}$, the codec circuit 330 generates the quantization signal S1[2]. Alternatively, if the sampling circuit 305 receives the control signal $CK_{3S}$ and the comparator circuits 320 receives the control signal $CK_{3C}$, the codec circuit 330 generates the quantization signal S1[3]. As mentioned above, in some embodiments, the flash ADC circuit 300 may exclude the codec circuit 330. Under this condition, the decision signals D[1]-D[N] may be outputted as bits of a corresponding one of the quantization signal S1[1], S1[2], and S1[3].

Figure 4:
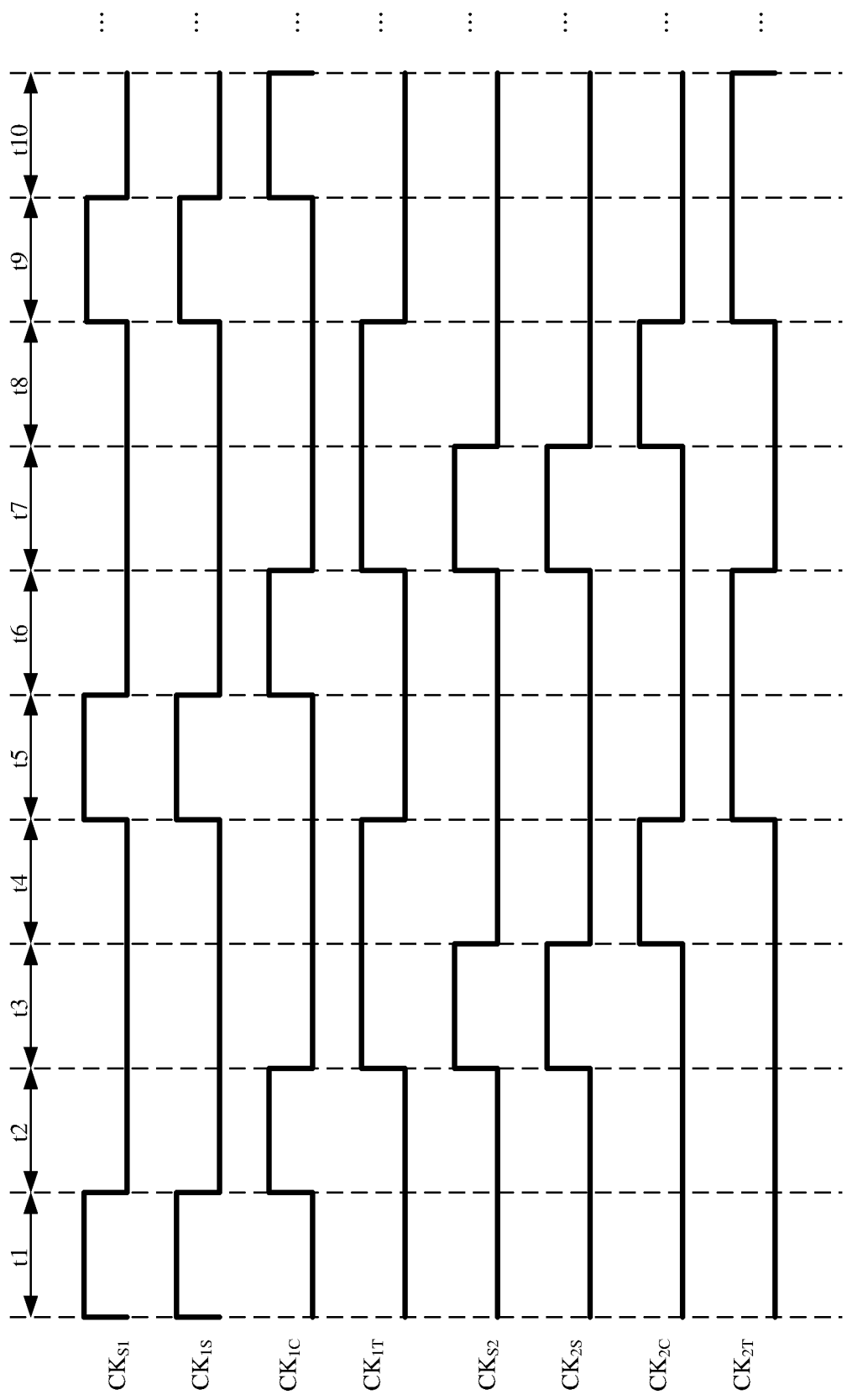
FIG. 4 illustrates a schematic diagram of operation timings of the time-interleaved analog to digital converter in FIG. 1A or FIG. 1B according to some embodiments of the present disclosure.

FIG. 4 illustrates a schematic diagram of operation timings of the time-interleaved analog to digital converter in FIG. 1A or FIG. 1B according to some embodiments of the present disclosure. During an interval t1, the control signal $CK_{S1}$ and the control signal $CK_{1S}$ having enabling levels.

Under this condition, the capacitor array circuit 110 and the flash ADC circuit 121 sample the input signal VIN concurrently. During an interval t2, the control signal $CK_{1C}$ has the enabling level. Under this condition, the flash ADC circuit 121 generates the quantization signal S1[1] according to the sampled input signal VIN', and the control logic circuit 150 generates the digital code D1 according to the quantization signal S1[1] to switch the capacitor array circuit 110. During an interval t3 and an interval t4, the control signal $CK_{1T}$ has the enabling level. Under this condition, the transfer circuit T1 may transfer the signal S10 (i.e., the first residue signal) from the capacitor array circuit 110 to the converter circuitry 130, and the converter circuitry 130 may generate the quantization signal S2 according to the second signal in the second residue signal (which is 0 at this time) and the signal S10. As a result, the encoder circuit 160 may combine the digital code D1 and the quantization signal S2 to be the digital output DO. After the quantization signal S2 is generated (e.g., after the interval t4), the clock signal $CK_{1F}$ (not shown) may be switched to be at the enabling level, such that the signal S10 (i.e., the second residue signal) is transferred from the capacitor array circuit 110 to the converter circuitry 130.

Moreover, during the interval t3, the control signal $CK_{S2}$ and the control signal $CK_{2S}$ have the enabling levels. Under this condition, the capacitor array circuit 111 and the flash ADC circuit 122 sample the input signal VIN concurrently. During the interval t4, the control signal $CK_{2C}$ has the enabling level. Under this condition, the flash ADC circuit 122 generates the quantization signal S1[2] according to the sampled input signal VIN', and the control logic circuit 150 may generate the digital code D2 according to the quantization signal S1[2] to switch the capacitor array circuit 111. During an interval t5 and an interval t6, the control signal $CK_{2T}$ has the enabling level. Under this condition, the transfer circuit T2 may transfer the signal S20 (i.e., the first residue signal) from the capacitor array circuit 111 to the converter circuitry 130, and the converter circuitry 130 may generate the quantization signal S2 according to this signal S20 and the previously received second residue signal. As a result, the encoder circuit 160 may combine the digital code D2 and the quantization signal S2 to be the digital output DO. After the quantization signal S2 is generated (e.g., after the interval t6), the control signal $CK_{2F}$ (not shown) may be switched to have the enabling level, such that the signal S20 (i.e., the second residue signal) is transferred from the capacitor array circuit 111 to the converter circuitry 130.

With this analogy, it is able to understand operations during intervals t7-t10, and thus the repetitious descriptions are not further given. As shown in FIG. 4, when the converter circuitry 130 performs the noise shaping signal conversion according to the first residue signal from the capacitor array circuit 110 (i.e., the signal S10) and the previously received second residue signal during a conversion phase (e.g., the intervals t3 and t4), the capacitor array circuit 111 samples the input signal VIN during a sampling phase (e.g., the interval t3), in which the conversion phase and the sampling phase are partially overlapped. Alternatively, when the converter circuitry 130 performs the noise shaping signal conversion according to the first residue signal from the capacitor array circuit 111 (i.e., the signal S20) and the previously received second residue signal during the conversion phase (i.e., the intervals t5 and t6), the capacitor array circuit 110 samples the input signal VIN during the sampling phase (e.g., the phase t5), in which the conversion phase and the sampling phase are partially overlapped.

Similarly, as shown in FIG. 4, when the converter circuitry 130 performs the noise shaping signal conversion according to the first residue signal from the capacitor array circuit 111 (i.e., the signal S20) and the previously received second residue signal during a first conversion phase (i.e., the intervals t5 and t6), the flash ADC circuit 121 generates the quantization signal S1[1] during a second conversion phase (e.g., the interval t6), in which the first conversion phase and the second conversion phase are partially overlapped. Alternatively, when the converter circuitry 130 performs the first residue signal from the capacitor array circuit 110 (i.e., the signal S10) and the previously received second residue signal during the first conversion phase (e.g., the intervals t7 and t8), the flash ADC circuit 122 generates the quantization signal S1[2] during the second conversion phase (e.g., the interval t8), in which the first conversion phase and the second conversion phase are partially overlapped. As shown in FIG. 4, the first conversion phase is longer than the second conversion phase and is longer than the sampling phase. With the above timing arrangements, the time-interleaved analog to digital converter 100 (or 105) is able to alternately sample the input signal VIN, and sequentially perform the noise shaping signal conversions to generate the digital output DO.

Figure 5:
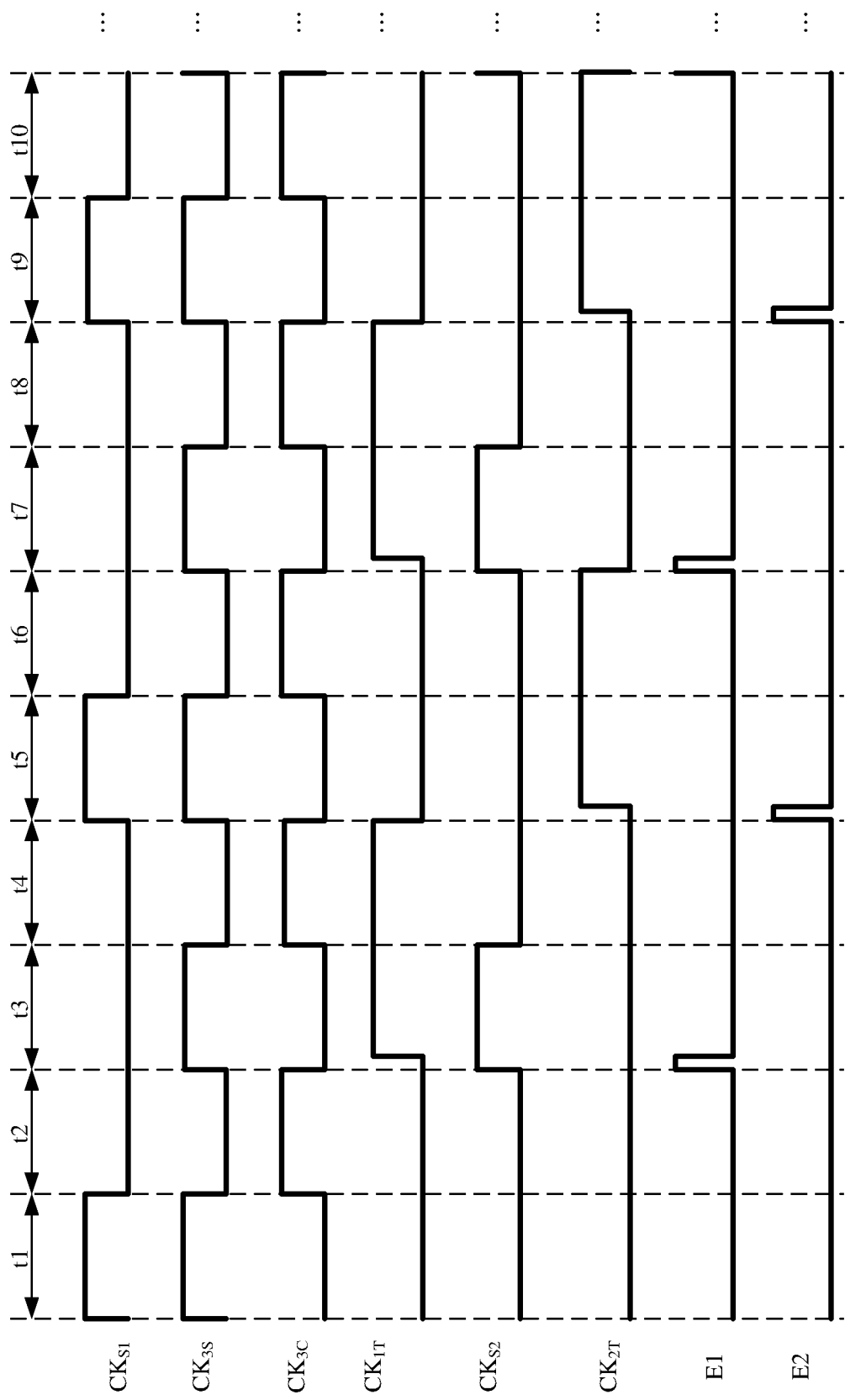
FIG. 5 illustrates a schematic diagram of operation timings of the time-interleaved analog to digital converter in FIG. 2A or FIG. 2B according to some embodiments of the present disclosure.

FIG. 5 illustrates a schematic diagram of operation timings of the time-interleaved analog to digital converter in FIG. 2A or FIG. 2B according to some embodiments of the present disclosure. As mentioned above, the enabling interval of the control signal $CK_{3S}$ is the combination of the enabling levels of the control signals $CK_{1S}$ and $CK_{2S}$, the enabling interval of the control signal $CK_{3C}$ is the combination of the enabling levels of the control signals $CK_{1C}$ and $CK_{2C}$. As shown in FIG. 4, the control signals $CK_{1S}$ and $CK_{2S}$ have the enabling levels during the interval t1, t3, t5, t7, and t9, respectively. Correspondingly, as shown in FIG. 5, the control signal $CK_{3S}$ has the enabling level during the interval t1, t3, t5, t7, and t9 as well. Similarly, as shown in FIG. 4, the control signals $CK_{1C}$ and $CK_{2C}$ have the enabling levels during the intervals t2, t4, t6, t8, and t10, respectively. Correspondingly, as shown in FIG. 5, the control signal $CK_{3C}$ has the enabling level during the intervals t2, t4, t6, t8, and t8 as well. As a result, most operations in FIG. 5 are the same as those in FIG. 4, and thus the repetitious descriptions are not further given.

As shown in FIG. 5, after the interval t2, the enable signal E1 is switched to have the enabling level. As a result, the control logic circuit 150 may generate the digital code D1 according to the quantization signal S1[3] generated from the flash ADC circuit 123, and transmit the digital code D1 to the capacitor array circuit 110. Similarly, after the interval t4, the enable signal E2 is switched to have the enabling level. As a result, the control logic circuit 150 may generate the digital code D2 according to the quantization signal S1[3] generated from the flash ADC circuit 123, and transmit the digital code D2 to the capacitor array circuit 111. With this analogy, it is understood the arrangements of the enable signal E1 and the enable signal E2.

As described above, the time-interleaved analog to digital converter provided in some embodiments of the present disclosure may generate digital code(s) mainly based on a flash analog to digital conversion, and may sequentially perform the noise shaping to improve the signal-to-noise ratio. As a result, the time-interleaved analog to digital converter is suitable for high-speed application.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A time-interleaved analog to digital converter, comprising:
    a plurality of capacitor array circuits configured to sequentially sample an input signal and generate a plurality of first residue signals according to a plurality of first quantization signals;
    a flash analog to digital converter circuitry configured to sample the input signal and sequentially generate the plurality of first quantization signals;
    a plurality of first transfer circuits configured to sequentially transfer the plurality of first residue signals from the plurality of capacitor array circuits according to a plurality of first control signals;
    a converter circuitry configured to perform a noise shaping signal conversion according to a first signal in the plurality of first residue signals and a second signal in plurality of second residue signals, in order to generate a second quantization signal;
    a plurality of second transfer circuits configured to sequentially transfer a plurality of second residue signals from the plurality of capacitor array circuits to the converter circuitry according to a plurality of second control signals, wherein the plurality of capacitor array circuits further generate the plurality of second residue signals in response to the noise shaping signal conversion; and
    an encoder circuit configured to generate a digital output according to a second quantization signal and a corresponding signal of the plurality of first quantization signals.

2. The time-interleaved analog to digital converter of claim 1, wherein the flash analog to digital converter circuitry and one of the plurality of capacitor array circuits sample the input signal concurrently.

3. The time-interleaved analog to digital converter of claim 1, wherein the flash analog to digital converter circuitry comprises a plurality of flash analog to digital converter circuits, and the plurality of flash analog to digital converter circuits are configured to sequentially sample the input signal and generate the plurality of first quantization signals according to the sampled input signal.

4. The time-interleaved analog to digital converter of claim 3, further comprising:
    a control logic circuit configured to generate a digital code according to the corresponding signal,
    wherein one of the plurality of capacitor array circuits is further configured to generate one of the plurality of first residue signals according to the digital code, and the encoder circuit is further configured to generate the digital output according to the digital code and the second quantization signal.

5. The time-interleaved analog to digital converter of claim 3, wherein a number of the plurality of flash analog to digital converter circuits is the same as a number of the plurality of capacitor array circuits.

6. The time-interleaved analog to digital converter of claim 3, wherein one of the plurality of flash analog to digital converter circuits comprises:
    a sampling circuit configured to sample the input signal to generate a sampled input signal;
    a voltage generator circuit configured to generate a plurality of voltages;
    a plurality of comparator circuits configured to compare the sampled input signal with each of the plurality of voltages to generate a plurality of decision signals; and
    a codec circuit configured to generate a plurality of bits in one of the plurality of first quantization signals according to the plurality of decision signals.

7. The time-interleaved analog to digital converter of claim 1, further comprising:
    a control logic circuit configured to generate a digital code according to the corresponding signal and output the digital code to a corresponding one of the plurality of capacitor array circuits according to a plurality of enable signals,
    wherein the corresponding one of the plurality of capacitor array circuits generates a corresponding one of the plurality of first residue signals according to the digital code, and the encoder circuit is further configured to generate the digital output according to the digital code and the second quantization signal.

8. The time-interleaved analog to digital converter of claim 1, wherein the converter circuitry performs the noise shaping signal conversion according to the first signal and the second signal during a conversion phase, the first signal is from a first capacitor array circuit in the plurality of capacitor array circuits, a second capacitor array circuit in the plurality of capacitor array circuits samples the input signal during a sampling phase, and the conversion phase and the sampling phase are partially overlapped.

9. The time-interleaved analog to digital converter of claim 8, wherein the conversion phase is longer than the sampling phase.

10. The time-interleaved analog to digital converter of claim 1, wherein the converter circuitry performs the noise shaping signal conversion according to the first signal and the second signal during a first conversion phase, the flash analog to digital converter circuitry generate the plurality of first quantization signals during a second conversion phase, and the first conversion phase and the second conversion phase are partially overlapped.

11. The time-interleaved analog to digital converter of claim 10, wherein the first conversion phase is longer than the second conversion phase.

12. The time-interleaved analog to digital converter of claim 1, wherein the encoder circuit is configured to combine a digital code and the second quantization signal to be the digital output, the digital code is generated according to the corresponding signal, and one of the plurality of capacitor array circuits and the flash analog to digital converter sample the input signal concurrently to respectively generate the first signal and the second signal.

13. The time-interleaved analog to digital converter of claim 1, wherein the converter circuitry comprises:
   a noise shaping circuit configured to process the second signal to generate a third signal; and
   a quantizer circuit configured to perform a quantization according to the third signal and the first signal to generate the second quantization signal.

14. The time-interleaved analog to digital converter of claim 1, wherein the flash analog to digital converter circuitry comprises only one flash analog to digital converter circuit.

* * * * *